(12) United States Patent
Chang et al.

(10) Patent No.: US 9,171,990 B2
(45) Date of Patent: Oct. 27, 2015

(54) METHOD OF HYBRID STACKED FLIP CHIP FOR A SOLAR CELL

(71) Applicant: Chang Gung University, Taoyuan County (TW)

(72) Inventors: Liann-Be Chang, Taoyuan County (TW); Yu-Lin Lee, Tainan (TW)

(73) Assignee: CHANG GUNG UNIVERSITY, Taoyuan County (TW)

( * ) Notice: Subject to any disclaimer, the term of this patent is extended or adjusted under 35 U.S.C. 154(b) by 290 days.

(21) Appl. No.: 14/034,631

(22) Filed: Sep. 24, 2013

(65) Prior Publication Data

US 2014/0024169 A1 Jan. 23, 2014

Related U.S. Application Data

(63) Continuation-in-part of application No. 11/746,698, filed on May 10, 2007, now abandoned.

(51) Int. Cl.
*H01L 31/18* (2006.01)
*H01L 31/0725* (2012.01)
*H01L 31/043* (2014.01)
*H01L 31/05* (2014.01)

(52) U.S. Cl.
CPC .......... *H01L 31/1856* (2013.01); *H01L 31/043* (2013.01); *H01L 31/0725* (2013.01); *H01L 31/18* (2013.01); *H01L 31/1848* (2013.01); *H01L 31/0508* (2013.01); *Y02E 10/544* (2013.01)

(58) Field of Classification Search
CPC .............. H01L 31/043; H01L 31/0508; H01L 31/0725; H01L 31/18; H01L 31/1856; H01L 31/1848; Y02E 10/544
USPC ...................................... 438/74, 77
See application file for complete search history.

(56) References Cited

U.S. PATENT DOCUMENTS

| | | | |
|---|---|---|---|
| 4,255,211 A | 3/1981 | Fraas | |
| 4,316,049 A | 2/1982 | Hanak | |
| 4,338,480 A | 7/1982 | Antypas et al. | |
| 5,853,497 A * | 12/1998 | Lillington et al. | .. H01L 31/0687 136/249 |
| 6,281,426 B1 | 8/2001 | Olson et al. | |
| 6,432,741 B1 | 8/2002 | Mueller et al. | |
| 6,939,790 B2 | 9/2005 | Chen et al. | |
| 2002/0170592 A1* | 11/2002 | Algora | ................ H01L 31/0232 136/244 |
| 2004/0200523 A1 | 10/2004 | King et al. | |

* cited by examiner

*Primary Examiner* — Matthew Martin (57) ABSTRACT

A method of hybrid stacked Flip chip for a solar cell onto which semiconductor layers of different materials are stacked in the Flip chip technology to solve the problem of lattices mismatch between the layers for further increase of the efficiency of solar cell.

10 Claims, 7 Drawing Sheets

METHOD OF HYBRID STACKED FLIP CHIP FOR A SOLAR CELL

BACKGROUND OF THE INVENTION

1. Field of the Invention

This invention relates to a method and technology of a hybrid stacked flip chip for a solar cell and, particularly, to that of manufacturing a simple and higher efficient solar cell.

2. Description of Related Art

Figure 4A:
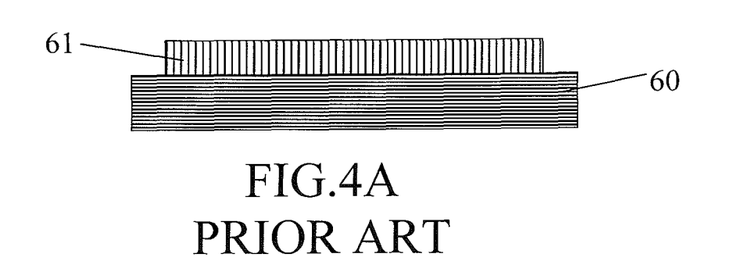
FIG. 4A through FIG. 4C are schematic views illustrating conventional embodiments.

As shown in FIG. 4A, the solar cell comprises a substrate 60 of silicon (Si), germanium (Ge), or Si/Ge. On the substrate 60, a P-N junction semiconductor layer 61, such as Si/SiGe, that may absorb a long wavelength (e.g. infrared rays), is formed. It has an efficiency of around only 15%.

Figure 4B:
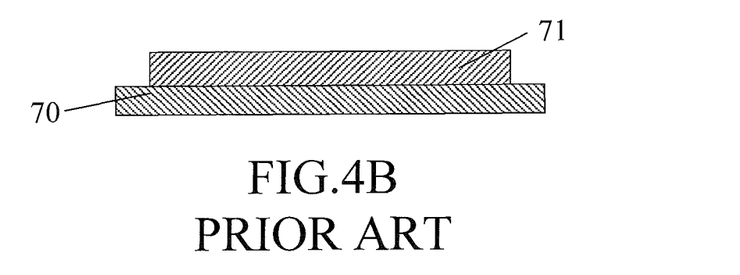

A compound solar cell is formed by a compound semiconductor on a substrate to absorb a medium wavelength solar spectrum. Owing to a direct bandgap, it has higher efficiency and absorbs the correspondent wavelength of around 25%. As shown in FIG. 4B, the solar cell comprises a substrate 70 of GaAs, AlGaAs, InGaP or GaP. On the substrate 70, a P-N junction semiconductor layer 71, such as GaAs/AlGaAs, GaAs/InGaP, GaP/GaP, GaAs/AlInGaP, and GaAs/AlGaAs, etc., that may absorb a medium wavelength (e.g. visible rays), is formed.

Figure 4C:
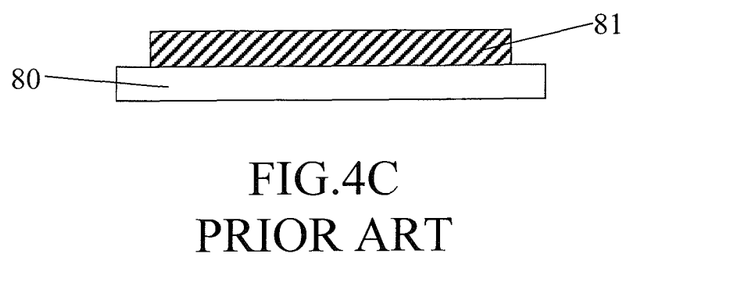

As shown in FIG. 4C, the solar cell comprises a substrate 80 of Al2O3 sapphire, silicon carbide, or ZnO. On the substrate 80, a P-N junction semiconductor layer 81, such as GaN/AlGaN, GaN/InGaN and InGaN/AlGaN that may absorb a short wavelength (e.g. ultraviolet rays), is formed.

However, each solar cell mentioned above may absorb only the correspondent long wavelength (as shown in FIG. 4A), medium wavelength (as shown in FIG. 4B), or the short wavelength (as shown in FIG. 4C), respectively.

Thus, recently, a tandem cell is provided in which materials of different bandgaps are stacked into the cell of multiple junctions.

Figure 5A:
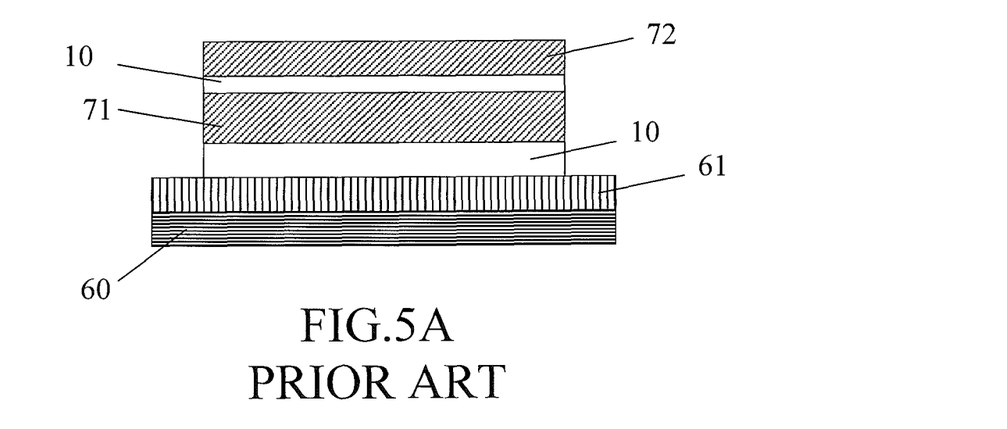
FIG. 5A and FIG. 5B are schematic views illustrating another conventional embodiment.

As shown in FIG. 5A, the solar cell comprises a substrate 60 of Si, Ge, or Si/Ge. On the substrate 60, a P-N junction semiconductor layer 61, such as Si and SiGe, that may absorb the long wavelength is stacked so as to absorb rays of light, and an tunnel junction 10 is formed on the P-N junction semiconductor layer 61. On the tunnel junction 10, a P-N junction semiconductor layer 71, such as GaAs, that may absorb the medium wavelength, is then stacked, and the tunnel junction 10 is formed on the P-N junction semiconductor layer 71. On the tunnel junction 10, a P-N junction semiconductor layer 72, such as AlGaAs or InGaP, which may absorb the medium wavelength, is then stacked.

Figure 5B:
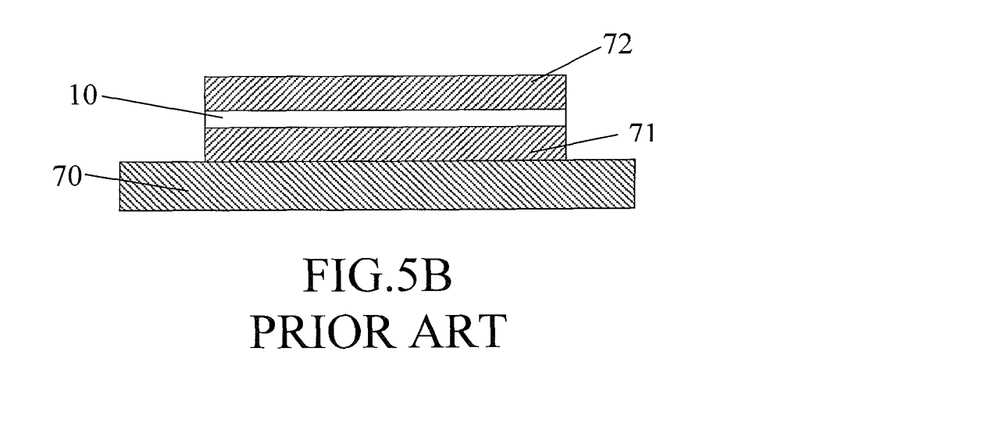

As shown in FIG. 5B, the solar cell comprises a substrate 70 of GaAs, As, or GaP. On the substrate 70, a P-N junction semiconductor layer 71, such as GaAs, that may absorb the medium wavelength, is then stacked, and the tunnel junction 10 is formed on the P-N junction semiconductor layer 71. On the tunnel junction 10, a P-N junction semiconductor layer 72, such as AlGaAs or InGaP, which may absorb the medium wavelength, is then stacked.

However, Si/SiGe, GaN/AlGaN, and GaAs/AlGaAs used for the semiconductors are quite different, so the semiconductor epitaxy when formed is easily polluted with each other, and lattice matching is also very different.

Typical tandem solar cell is comprised of a p-type semiconductor connected to an n-type semiconductor, and a parallel p-type semiconductor connected to an n-type semiconductor and has two terminals. Total voltage is a sum of V1 and V2. Current of the typical solar cell is no greater than Imin. Power P is a sum of (V1+V2)*Imin.

Consequently, because of the technical defects of described above, the present invention was developed, which can effectively improve the defects described above.

SUMMARY OF THE INVENTION

This invention relates to a method of a hybrid stacked flip chip for a solar cell, comprising:

step 1 of forming a solar cell with at least one pair of P-N junction semiconductor layers and making each P-N junction semiconductor layer to absorb various wavelengths of solar spectrum by corresponding to different materials;

step 2 of forming another solar cell with at least one P-N junction semiconductor layer of which the series of materials are different from step 1; and step 3 of stacking each of the P-N junction semiconductor layers described at step 1 and step 2 in the flip chip technology and stacking in order the P-N junction semiconductor layers from a long wavelength to a short wavelength.

Thus, the flip chip technology is used in this invention to stack different series solar cells for increasing the efficiency of the solar cell and for solving the problem of lattice mismatch.

DETAILED DESCRIPTION OF THE PREFERRED EMBODIMENTS

Now, the present invention will be described more specifically with reference to the following embodiments. It is to be noted that the following descriptions of preferred embodiments of this invention are presented herein for purpose of illustration and description only; and it is not intended to be exhaustive or to be limited to the precise form disclosed.

Figure 1:
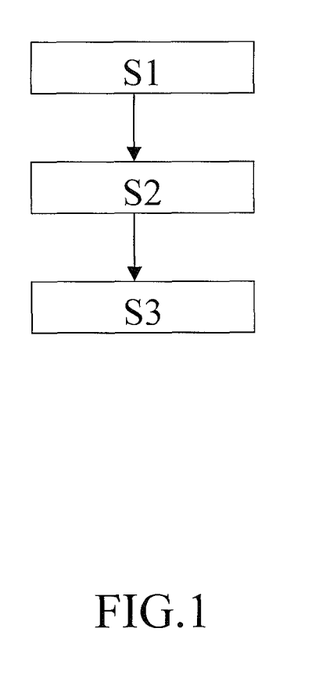
FIG. 1 is a flow chart of this invention.

This invention relates to a method of a hybrid stacked flip chip for a solar cell and is used to stack a solar cell onto another solar cell in the flip chip technology, as shown in FIG. 1, the method comprising:

step 1 of forming a solar cell with at least one pair of P-N junction semiconductor layers and making each P-N junction semiconductor layer to absorb various wavelengths of solar spectrum by corresponding to different materials;

step 2 of forming another solar cell with at least one P-N junction semiconductor layer of which the series of materials are different from step 1; and step 3 of stacking each of the P-N junction semiconductor layers described at step 1 and step 2 in the flip chip technology and stacking in order the P-N junction semiconductor layers from a long wavelength to a short wavelength.

In the following description, there are figures illustrating embodiments of this invention.

Figure 2A:
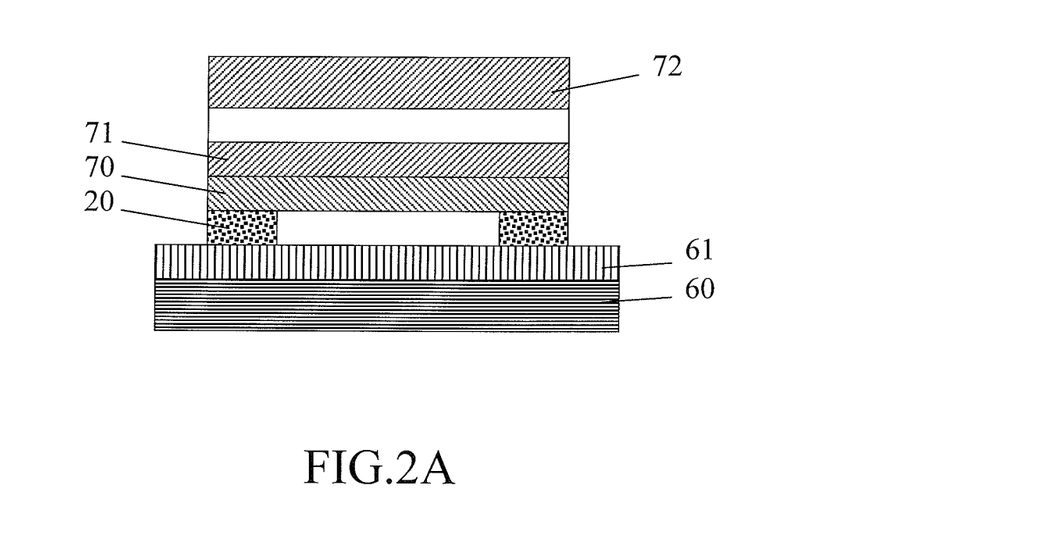
FIG. 2A through FIG. 2D are schematic views illustrating embodiments of this invention.

Refer to FIG. 2A, it illustrates:

a formed P-N junction semiconductor layer 61 of Si and Ge that may absorb a long wavelength, and its substrate 60 of Si, Ge, or Si/Ge;

formed P-N junction semiconductor layers 71 and 72 of As, Ga, and P that may absorb a medium wavelength, and its substrate 70 of InP, GaAs, or GaP; and in the flip chip technology, the P-N junction semiconductor layers 71 and 72 of As, Ga, and P that may absorb the medium wavelength being stacked onto the P-N junction semiconductor layer 61 of Si and Ge that may absorb the long wavelength, in which the P-N junction semiconductor layers 71 and 72 of As, Ga, and P that may absorb the medium wavelength lie on the substrate 70 of InP, GaAs or GaP.

The series of materials of the P-N junction semiconductor layer 61 of Si and Ge that may absorb the long wavelength and those of the P-N junction semiconductor layers 71 and 72 of As, Ga, and P that may absorb the medium wavelength are different so that connection bumps 20 may be formed between the two P-N junction semiconductor layers, and the two P-N junction semiconductor layers of different materials are combined together in the form of a flip chip.

Figure 2B:
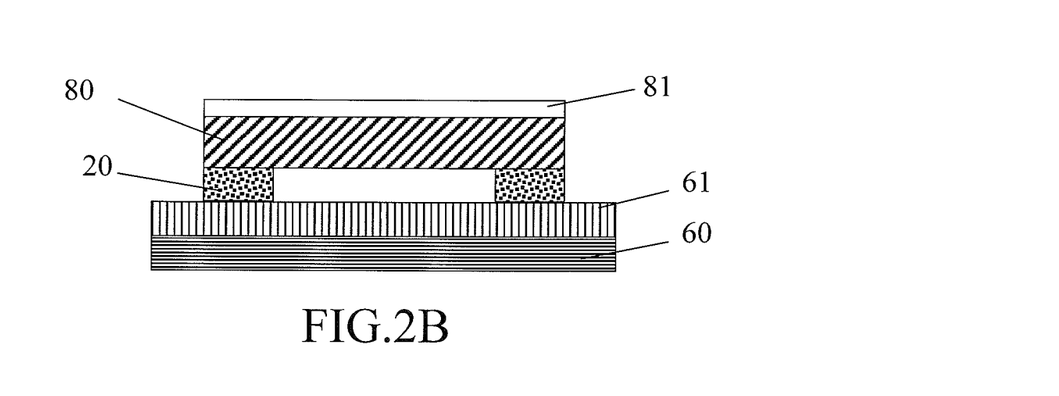

Refer to FIG. 2B, it illustrates:

formed P-N junction semiconductor layers 61 of Si and Ge that may absorb the long wavelength, and its substrate 60 of Si, Ge, or Si/Ge;

formed P-N junction semiconductor layers 80 of Ga, In, Al and N that may absorb the short wavelength, and its transparent substrate 81 of Al2O3 sapphire, silicon carbide, or ZnO; and in the flip chip technology, the P-N junction semiconductor layers 80 of Ga, In, Al and N that may absorb the short wavelength being stacked onto the P-N junction semiconductor layers 61 of Si and Ge that may absorb the long wavelength, in which the transparent substrate 81 of Al2O3 sapphire, silicon carbide, or ZnO lies on the P-N junction semiconductor layers 80 of Ga, In, Al and N that may absorb the short wavelength.

The series of materials of the P-N junction semiconductor layers 61 of Si and Ge that may absorb the long wavelength and those of the P-N junction semiconductor layers 80 of Ga, In, Al and N that may absorb the short wavelength are different so that connection bumps 20 may be formed between the two P-N junction semiconductor layers, and the two P-N junction semiconductor layers of different materials are combined together in the form of a flip chip.

Figure 2C:
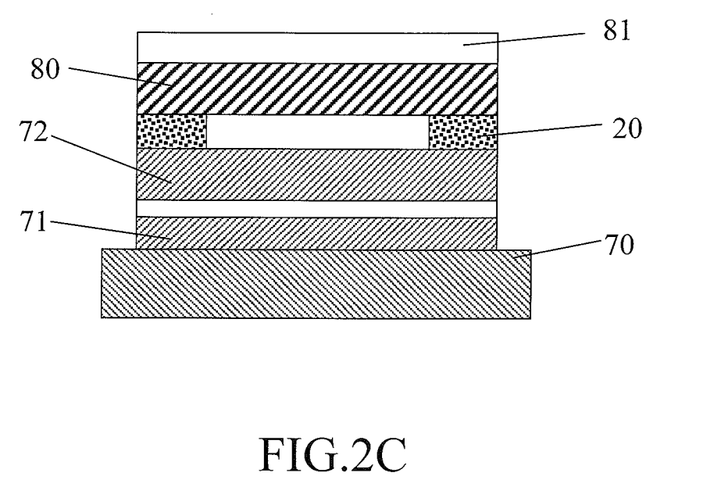

Refer to FIG. 2C, it illustrates:

formed P-N junction semiconductor layers 71 and 72 of As, Ga, and P that may absorb the medium wavelength, and its substrate 70 of InP, GaAs or GaP;

formed P-N junction semiconductor layers 80 of Ga, In, Al and N that may absorb the long wavelength, and its transparent substrate 81 of $Al_2O_3$ sapphire, silicon carbide, or ZnO; and in the flip chip technology, the P-N junction semiconductor layers 80 that may absorb the short wavelength being stacked onto the P-N junction semiconductor layers 71 and 72 of As, Ga, and P that may absorb the medium wavelength, in which the transparent substrate 81 of $Al_2O_3$ sapphire, silicon carbide, or ZnO lies on the P-N junction semiconductor layers 80 of Ga, In, Al and N that may absorb the short wavelength.

The series of materials of the P-N junction semiconductor layers 71 and 72 of As, Ga, and P that may absorb the medium wavelength and those of the P-N junction semiconductor layers 80 of Ga, In, Al and N that may absorb short the wavelength are different so that connection bumps 20 may be formed between the two P-N junction semiconductor layers, and the two P-N junction semiconductor layers of different materials are combined together in the form of a flip chip.

Figure 2D:
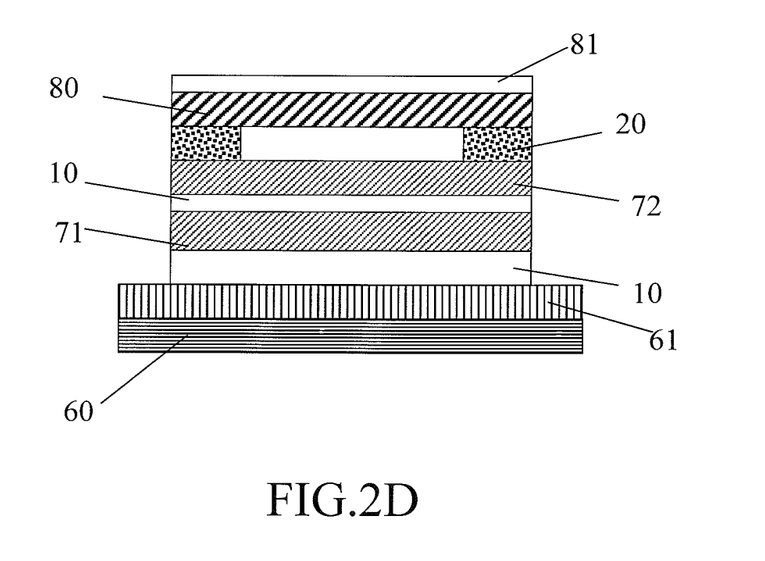

Refer to FIG. 2D, it illustrates:

a substrate 60 of Si, Ge, or Si/Ge on which P-N junction semiconductor layers 61, such as Si and SiGe, that may absorb the long wavelength is stacked; a tunnel junction 10 being formed on the layer 61, and a P-N junction semiconductor layers 71, such as GaAs, that may absorb the medium wavelength being formed on the tunnel junction 10; a tunnel junction 10 being again formed on the layer 71, and a P-N junction semiconductor layer 72, such as AlGaAs and InGaP, that may absorb the medium wavelength being stacked being formed on the tunnel junction 10;

formed P-N junction semiconductor layers 80 of Ga, In, Al an N, that may absorb the long wavelength, and its transparent substrate 81 of Al2O3 sapphire, silicon carbide, or ZnO; and in the flip chip technology, the P-N junction semiconductor layers 80 of Ga, In, Al and N that may absorb the short wavelength being stacked onto the P-N junction semiconductor layer 72 that may absorb the medium wavelength.

The series of materials of the P-N junction semiconductor layers 80 of Ga, In, Al and N that may absorb the long wavelength and those of the P-N junction semiconductor layers 72 that may absorb the medium wavelength are different so that connection bumps 20 may be formed between the two P-N junction semiconductor layers, and the two P-N junction semiconductor layers of different materials are combined together in the form of a flip chip.

Figure 3A:
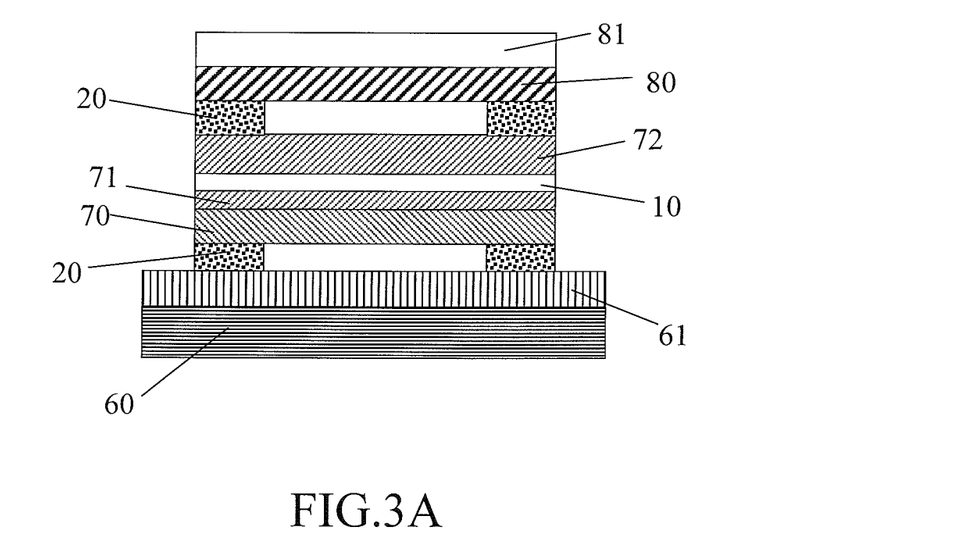
FIG. 3A through FIG. 3C are schematic view illustrating three another preferred embodiments of this invention.

Refer to FIG. 3A, it illustrates:

formed P-N junction semiconductor layers 61 of Si and Ge, such as Si and Si/Ge, that may absorb the long wavelength;

formed P-N junction semiconductor layers 71 and 72 of As, Ga, and P, such as GaAs/AlGaAs, GaAs/InGaP, GaP/GaP, GaAs/AlIn GaP, and GaAs/AlGaAs . . . etc., that may absorb the medium wavelength;

P-N junction semiconductor layers 80, such as GaN/AlGaN, GaN/InGaN and InGaN/AlGaN, that may absorb the short wavelength; and in the flip chip technology, the P-N junction semiconductor layers 71 and 72 that may absorb the medium wavelength and the P-N junction semiconductor layers 80 that may absorb the short wavelength being stacked in order onto the P-N junction semiconductor layers 61 of Si and Ge that may absorb the long wavelength.

The series of materials of the P-N junction semiconductor layers 61 of Si and Ge that may absorb the long wavelength, those of the P-N junction semiconductor layers 71 and 72 of As, Ga, and P that may absorb the medium wavelength, and those of the P-N junction semiconductor layers of Ga, In, Al and N that may absorb the short wavelength are different so that connection bumps 20 may be formed between the P-N junction semiconductor layers, and the P-N junction semiconductor layers of different materials are combined together in the form of a flip chip.

Figure 3B:
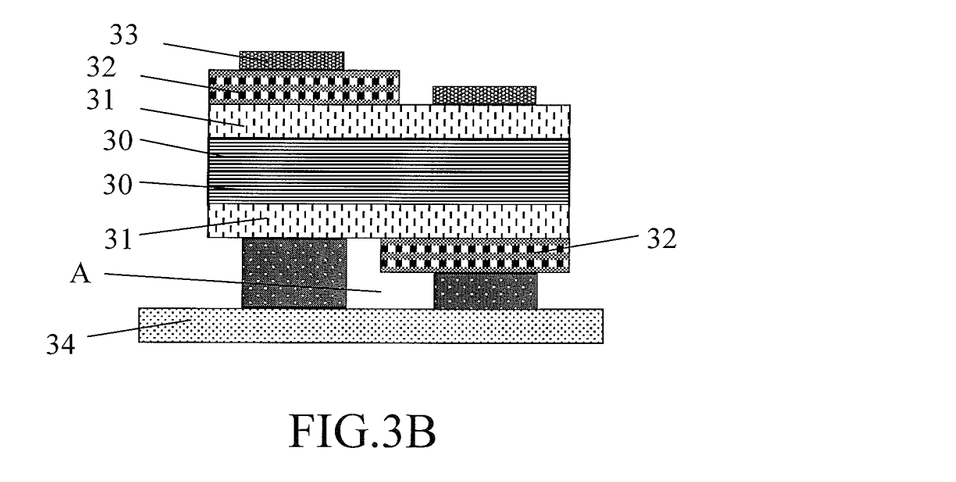

Referring to FIG. 3B, another embodiment illustrates:

formed a substrate 30 of germanium (Ge). On the substrate 30, an n-type semiconductor 31 is formed. On the n-type semiconductor 31, a p-type semiconductor 32 of silicon (Si) or germanium (Ge) is formed. The p-type semiconductor 32 is subject to photolithography and etching to expose a portion of the n-type semiconductor 31. Both the n-type semiconductor 31 and the p-type semiconductor 32 can absorb long wavelength. One substrate 30 is stacked on the other substrate 30 in an opposite manner by using flip chip technology. The lower n-type semiconductor 31 and p-type semiconductor 32 are disposed above a reflective layer 34. Top of the p-type semiconductor 32 and top of the n-type semiconductor 31 are formed with two electrodes 33 respectively.

Figure 3C:
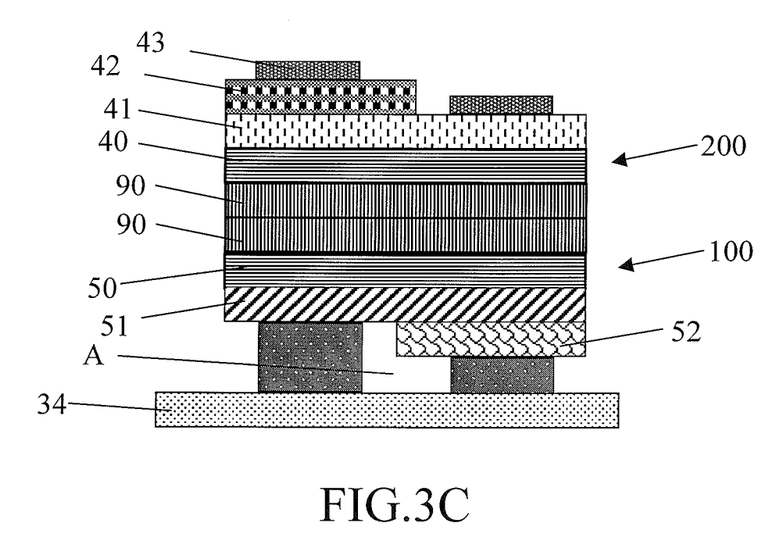

Referring to FIG. 3C, still another embodiment illustrates:

formed a substrate 50 of silicon (Si), germanium (Ge), Si/Ge, GaAs, As, or GaP. On a bottom of the substrate 50, an n-type semiconductor 51 is formed and a p-type semiconductor 52 is formed on a bottom of the n-type semiconductor 51. A first solar cell 100 is comprised of the substrate 50, the n-type semiconductor 51, and the p-type semiconductor 52. The n-type semiconductor 51 and the p-type semiconductor 52 are of Si, Ge, As, Ga, or P. The p-type semiconductor 52 is subject to photolithography and etching to expose a portion of the n-type semiconductor 51. The first solar cell 100 can absorb long wavelength (e.g. infrared rays and visible light). Top of the substrate 50 is coated with a metal layer 90.

formed a substrate 40 of GaAs, As, GaP, $Al_2O_3$, SiC, or ZnO. On a top of the substrate 40, an n-type semiconductor 41 is formed and a p-type semiconductor 42 is formed on a top of the n-type semiconductor 41. A second solar cell 200 is comprised of the substrate 40, the n-type semiconductor 41, and the p-type semiconductor 42. The n-type semiconductor 41 and the p-type semiconductor 42 are of As, Ga, P, or nitrogen (N). The p-type semiconductor 42 is subject to photolithography and etching to expose a portion of the n-type semiconductor 41. The second solar cell 200 can absorb short wavelength (e.g. ultraviolet rays). Bottom of the substrate 40 is coated with a metal layer 90. The metal layer 90 of the second solar cell 200 is stacked on the metal layer 90 of the first solar cell 100 in an opposite manner. Top of the p-type semiconductor 42 and top of the n-type semiconductor 41 are formed with two electrodes 43 respectively.

Above two embodiments show how to join two substrates by using flip chip technology. Thus, there is no chip incompatibility. A three-terminal solar cell is formed by stacking p-type semiconductor, n-type semiconductor, n-type semiconductor, and p-type semiconductor. Power (P) of the solar cell is V1×I1+V2×I2. Performance of the solar cell of the invention is greater than that of a typical solar cell. Further, its joining strength is greatly improved. While two joined substrates may adversely affect light absorption of the underlying solar cell, it can be improved by forming a space A under the solar cell.

In FIGS. 2A through 2D and FIGS. 3A through 3C, it is more convenient and easier to be electrically conductive to connect a chip with the connection bumps 20 in the flip chip technology than connecting a conventional solar cell with a tunnel junction. Thus, the materials that may absorb the long, medium, and short wavelengths are better in efficiency and solve the problem of lattice mismatch. Further, in this invention, a lens (not shown) may be arranged on the solar cell to concentrate the beams of light so that the area of the solar cell under the lens may be reduced. Further, the cost of the solar cell according to this invention may be down.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method comprising the steps of:
   forming a first solar cell including a substrate, an n-type semiconductor grown on the substrate, and a p-type semiconductor grown on the n-type semiconductor wherein the p-type semiconductor is subject to photolithography and etching to expose a portion of the n-type semiconductor, the first solar cell is capable of absorbing a first wavelength, and a metal layer is disposed on a bottom of the first solar cell;
   forming a second solar cell including a substrate, an n-type semiconductor grown on the substrate, and a p-type semiconductor grown on the n-type semiconductor wherein the p-type semiconductor is subject to photolithography and etching to expose a portion of the n-type semiconductor, the second solar cell is capable of absorbing a second wavelength, and a metal layer is disposed on a bottom of the second solar cell; and
   disposing the metal layer of the second solar cell on the metal layer of the first solar cell by flip chip so that the second solar cell is inverted to dispose on the first solar cell with a three-terminal device being formed, the p-type semiconductor and the n-type semiconductor of the first solar cell each are connected to a reflective layer, and the p-type semiconductor and the n-type semiconductor of the second solar cell are each connected to an electrode.

2. The method according to claim 1, wherein the n-type semiconductor and the p-type semiconductor of the first solar cell each are formed of Si, Ge or SiGe for absorbing a long wavelength.

3. The method according to claim 1, wherein the n-type semiconductor and the p-type semiconductor of one of the first and second solar cells each are formed of Al, Ga, In, As and P for absorbing a medium wavelength.

4. The method according to claim 1, wherein the first wavelength is longer than the second wavelength.

5. The method according to claim 1, wherein the n-type semiconductor and the p-type semiconductor of the first solar cell each are formed of Si and Ge for absorbing a long wavelength, and the n-type semiconductor and the p-type semiconductor of the second solar cell each are formed of Ga, In, Al and N for absorbing a short wavelength.

6. The method according to claim 1, wherein the n-type semiconductor and the p-type semiconductor of the first solar cell each are formed of As and P for absorbing a medium wavelength, and the P-N junction semiconductor layer of the second layer is formed of Ga, In, Al and N for absorbing a short wavelength.

7. The method according to claim 1 wherein forming the first solar cell includes forming the n-type semiconductor and the p-type semiconductor of the first solar cell to absorb a long wavelength; and wherein forming the second solar includes forming the n-type semiconductor and the p-type semiconductor of the second solar cell to absorb a medium wavelength less than the long wavelength.

8. The method according to claim 7, wherein forming the n-type semiconductor and the p-type semiconductor of the second solar cell comprises forming the n-type semiconductor and the p-type semiconductor as two layers and forming a tunnel junction layer between the two layers in order to increase the conductivity of the two layers connected in series.

9. The method according to claim 1, wherein the substrate of the first solar cell and the substrate of the second solar cell each are of metal.

10. The method according to claim 9, wherein the substrate of the first solar cell and the substrate of the second solar cell each are of germanium.

* * * * *